United States Patent

Nara et al.

[11] Patent Number: 5,965,301
[45] Date of Patent: Oct. 12, 1999

[54] METHOD FOR REPAIRING PHOTOMASK BY REMOVING RESIDUAL DEFECT IN SAID PHOTOMASK

[75] Inventors: Masami Nara; Toshifumi Yokoyama; Tsukasa Abe, all of Shinjuku-Ku, Japan

[73] Assignee: Dai Nippon Printing Co., Ltd., Japan

[21] Appl. No.: 08/976,453

[22] Filed: Nov. 25, 1997

[30] Foreign Application Priority Data

Nov. 26, 1996 [JP] Japan .................................. 8-329028

[51] Int. Cl.⁶ ...................................................... G03F 9/00
[52] U.S. Cl. .............................................................. 430/5
[58] Field of Search ............................. 430/5, 222, 323; 382/144, 149

[56] References Cited

U.S. PATENT DOCUMENTS

5,747,196  5/1998  Chao et al. ................................. 430/5
5,799,104  8/1998  Nakamura et al. ......................... 430/5

*Primary Examiner*—S. Rosasco
*Attorney, Agent, or Firm*—Parkhurst & Wendel, L.L.P

[57] ABSTRACT

A method for repairing a photomask by removing a residual defect in the photomask is provided which can solve problems, involved in repair of the photomask by the conventional laser beam irradiation, such as various types of maladjustments, limitation of focusing of a laser beam, creation of roughening in the repaired area, and problems, involved in repair of the photomask by focused ion beam irradiation, such as damage to a transparent substrate and a gallium stain. The method comprises the steps of: (a) applying actinic radiation to the residual defect area to remove the residual defect except for a defect edge region having a predetermined width from the periphery of the residual defect area over the whole periphery of the residual defect area; and (b) removing the defect edge region, remaining unremoved by the physical means, having a predetermined width from the periphery of the residual defect area over the whole periphery of the residual defect area by chemical etching with a chemical, the predetermined width being such that the influence of the actinic radiation does not extend over the outside of the residual defect area and, at the same time, the etching time can be set so that the region having a predetermined width from the periphery is removed by the chemical etching without any substantial influence on other layers including a light-shielding layer.

11 Claims, 11 Drawing Sheets

METHOD FOR REPAIRING PHOTOMASK BY REMOVING RESIDUAL DEFECT IN SAID PHOTOMASK

BACKGROUND OF THE INVENTION

1. Field of the Invention

The present invention relates to a method for repairing a photomask by removing a residual defect in the photomask and particularly to a method for repairing a phase shift photomask by removing a residual defect in the photomask.

2. Background Art

In recent years, an increase in integration density in a semiconductor integrated circuit has resulted in an ever-increasing demand for an increase in fineness also in a reticule used in the preparation of this circuit. For example, for DRAM, the line width of a device pattern transferred from a reticule for 16 M DRAM is as small as 0.5 $\mu$m. Further, a device pattern of 64 M DRAM requires a resolution of a line width of 0.35 $\mu$m. The conventional light exposure system using a stepper has reached the limit of the ability to provide a further increased fineness.

This inability has led to studies on various methods that can increase the resolution of the device pattern to a level usable for practical use.

Among others, a phase shift photomask that uses the conventional stepper exposure system and can increase the resolution of the device pattern transferred from the reticule has attracted attention.

Figure 11:
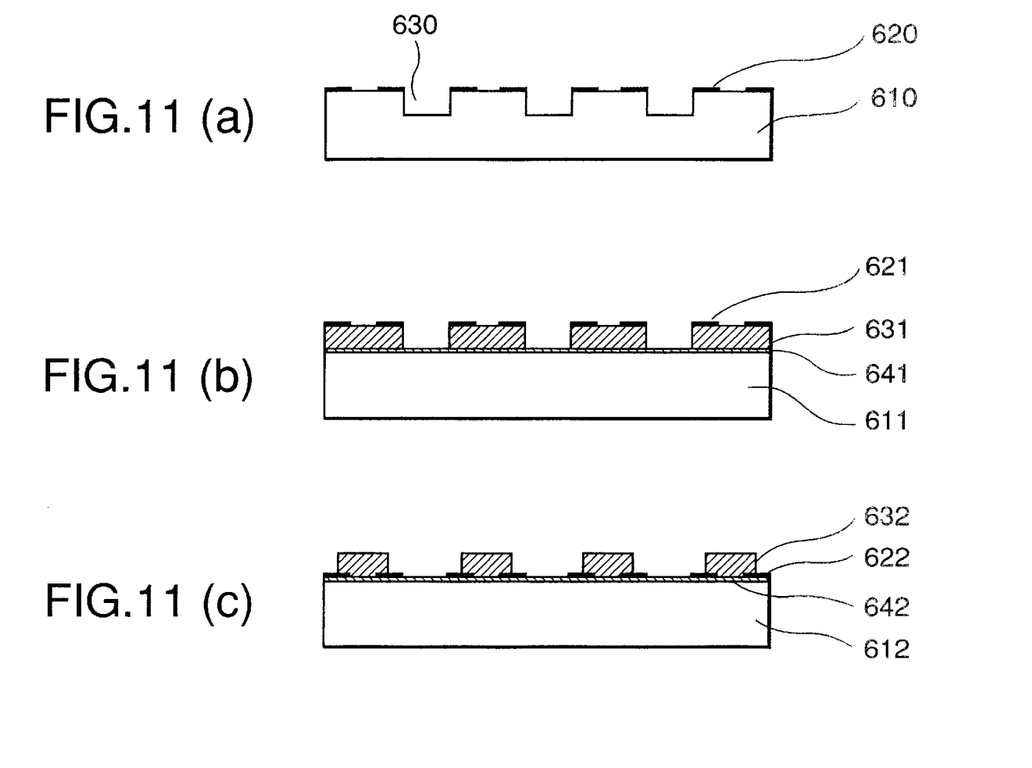
FIG. 11 is a schematic diagrams showing various types of photomasks, wherein FIG. 11 (a) is a cross-sectional view of a quartz engraving type Levenson phase shift photomask, FIG. 11 (b) is a cross-sectional view of a Cr on shifter type phase shift photomask, and FIG. 11 (c) shows a shifter on Cr type phase shift photomask.
Figure 12:
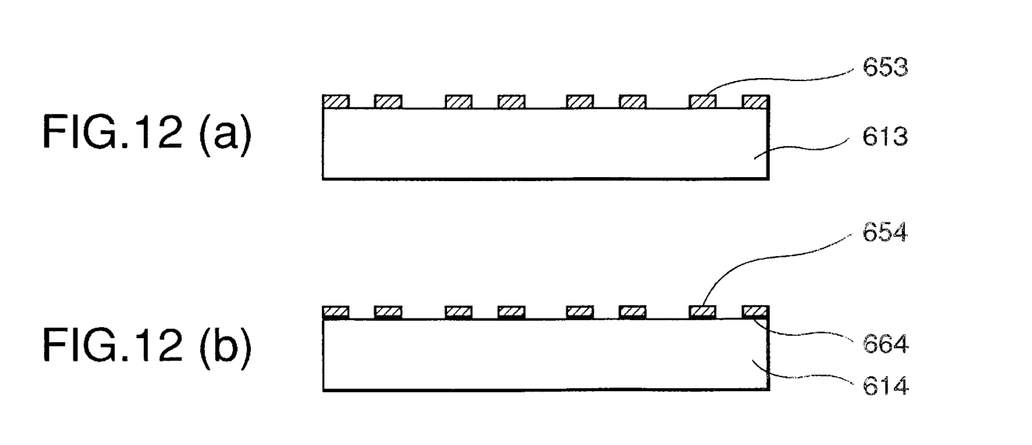
FIG. 12 a schematic diagram of a photomask provided with a halftone pattern, wherein FIG. 12 (a) is a cross-sectional view of a photomask provided with a halftone layer having a single layer structure and FIG. 12 (b) is a cross-sectional view of a photomask provided with a halftone layer having a multilayer structure.

Various phase shift photomasks have been proposed in the art, and, of them, a Levenson phase shift photomask (alternating phase shift mask) shown in FIG. 11 (a) and an attenuated phase shift photomask shown in FIG. 12 (b) have been put to practical use.

For the photomask shown in FIG. 12 (a), a light-shielding layer having a repeated pattern is provided on a transparent substrate, and a shifter layer 631, which functions to change the phase of the exposing light to half-wavelength, is provided in every other space section among space sections between adjacent light-shielding layers. On the other hand, for the photomask shown in FIG. 11 (a), a transparent substrate 610 is engraved to change the phase of exposing light to half-wavelength, and this type of photomask is known as "substrate engraving type." In this case, when a quartz substrate is used as the transparent substrate, the photomask is known as "quartz engraving type." FIG. 11 (b) shows a "Cr on shifter" type photomask wherein an SiO$_2$ shifter layer 631 is provided under the light-shielding layer 621 to change the phase of the exposing light by a half-wavelength. FIG. 11 (c) shows "shifter on Cr" type photomask wherein an SiO$_2$ shifter layer 632 is provided on the top of the light-shielding layer 622 to change the phase of the exposing light by half-wavelength.

FIG. 12 shows a photomask wherein a halftone pattern is provided and the half-wavelength change of the phase is performed by utilizing a part of the halftone section, wherein FIG. 12 (a) shows a photomask having a halftone layer having a single layer structure of a nitride oxide layer or the like and FIG. 12 (b) shows a photomask having a halftone layer having a multilayer structure of a nitride oxide layer 654 and a nitride layer 664 or the like.

Residual defects, which partially deteriorate the exposing light transmittance of the mask, are frequently created in the course of the production of the above phase shift photomasks.

The presence of residual defects in the mask makes it impossible to prepare a desired pattern by the transfer. Therefore, the photomask with residual defects has been repaired by physically or chemically removing the residual defect area to recover the light transmittance of the photomask in its residual defect area and an area around the residual defect area. A demand for an increase in fineness of the device pattern, however, has lead to a demand for removal of defects having a smaller size and a further improvement in accuracy of the repair of the photomask.

For repairing the photomask by removing a residual defect in the photomask, a laser beam irradiation repair method has been used wherein the defect area is evaporated and removed by a laser beam, such as YAG.

In this laser beam irradiation repair method, a laser beam, which has been widened to some extent and adjusted to predetermined form (usually in a rectangular form), size and intensity distribution by means of an aperture, is further concentrated and focused after passage through the aperture and then applied to the defect area to be removed. The size of the laser beam irradiation area may be varied by varying the size of the aperture so as to cope with various defect sizes and shapes.

Due to maladjustment of the aperture, maladjustment of focus, maladjustment of optical axis and the like, the shaped laser beam applied is not even in its intensity at the edge thereof, generally resulting in nonlinear and rough edges in the repaired end portion and often resulting in "roll-up" of the light-shielding layer of the photomask.

Further, when the defect area is evaporated and removed by a laser beam, a part of the underlying transparent substrate (usually a quartz substrate) also is evaporated to a depth of about 10 to 50 Å, creating roughening of the repaired area.

Although the roughened repaired area poses no particular problem in the case of exposure using an i-line stepper, it becomes a problem in the adoption of shorter wavelength light in the exposure at the time of transfer of the photomask. For example, the roughness of the repaired area is a severe problem in the transfer using an excimer laser as the light source for the exposure.

Further, the laser beam has focusing limits due to diffraction. This limit is generally regarded to be about 0.5 $\mu$m.

At the present time, in 16 M DRAM, a residual defect having a size of 0.5 $\mu$m is inspected and removed. This corresponds to the limit of the laser beam focusing ability. In 64 M DRAM, repair of the photomask on a level beyond the laser beam focusing ability is required.

On the other hand, instead of the repair using the laser beam, a method for removing a residual defect by means of a focused ion beam has become adopted as means which could cope with the demand for an increase in the fineness of the device pattern.

This method, however, suffers from a problem that the repair area cannot be limited to only the defect area due to irregular defect shape, often leading to damage to the transparent substrate (quartz glass or the like) in its area around the defect. An additional problem involved in this method is that gallium commonly used as an ion beam is unfavorably implanted into the underlying transparent substrate, creating a phenomenon called "gallium stain," which results in lowered light transmittance of the photomask in its repaired area.

In recent years, in order to reduce the gallium stain or the like, gas assisted etching is being put to practical use. In this method, excitation is performed by means of gallium ion to selectively etch the defect area alone. Even this method, however, cannot recover the light transmittance perfectly. Therefore, it is needless to say that recovery of the light transmittance cannot be achieved by the above method in the case of shorter wavelength light in the exposure.

As described above, the demand for an increase in fineness of the device pattern has lead to an ever-increasing demand for removal of defects having a smaller size and a further improvement in accuracy of the repair of the photomask. For this reason, various types of maladjustments, focusing limit of the laser beam, and creation of roughening in the repaired area involved in the repair of the photomask by the conventional laser beam irradiation, and damage to the transparent substrate (quartz glass or the like) and gallium staining involved in the repair of the photomask by the focused ion beam irradiation have become more and more severe problems.

SUMMARY OF THE INVENTION

An object of the present invention is to provide a method for repairing a photomask by removing a residual defect in the photomask which can solve the above problems of the prior art and can be put to practical use.

According to the present invention, the above object can be attained by a method for repairing a photomask by removing a residual defect, in the photomask, causative of a partial deterioration in light transmittance of the photomask in its residual defect area and an area around the residual defect area to recover the light transmittance of said areas in the photomask, the method comprising the steps of:

(a) applying actinic radiation to the residual defect area to physically remove the residual defect except for a defect edge region having a predetermined width from the periphery of the residual defect area over the whole periphery of the residual defect area: and (b) removing the defect edge region, remaining unremoved by the physical means, having a predetermined width from the periphery of the residual defect area over the whole periphery of the residual defect area by chemical etching with a chemical, the predetermined width being such that the influence of the actinic radiation does not extend over the outside of the residual defect area and, at the same time, the etching time can be set so that the defect edge region having a predetermined width from the periphery can be removed by the chemical etching without any substantial influence on other layers including a light-shielding layer.

According to a preferred embodiment of the present invention, the actinic radiation is a laser beam and, if necessary, a transparent substrate, constituting the photomask, in its area repaired by removing the residual defect is treated with a chemical to remove irregularities in the repaired area.

According to another preferred embodiment of the present invention, the actinic radiation is a laser beam and the chemical for chemical etching is a hot alkali or a solution composed mainly of hydrofluoric acid.

According to still another preferred embodiment of the present invention, the actinic radiation is a focused ion beam and, if necessary, the area repaired by removing the residual defect is treated with a chemical to remove a gallium stain created by the focused ion beam irradiation.

According to a further preferred embodiment of the present invention, the actinic radiation is a focused ion beam and the chemical for chemical etching is a hot alkali or a solution composed mainly of hydrofluoric acid.

According to a still further preferred embodiment of the present invention, in the repair of the photomask, assist gas enhances the etching simultaneously with the focused ion beam irradiation.

Preferably, the photomask is a phase shift photomask. According to a preferred embodiment of the present invention, the phase shift photomask is a halftone phase shift photomask or a Levenson phase shift photomask. The Levenson phase shift photomask is preferably of a quartz substrate engraving type using a quartz substrate as a transparent substrate or of a "Cr on shifter" type. Preferably, the quartz substrate in its portion underlying the light-shielding layer or the phase shifter layer has an undercut.

According to a preferred embodiment of the present invention, the Levenson phase shift photomask is of a quartz substrate engraving type using a quartz substrate as a transparent substrate, the light-shielding layer is composed mainly of chromium, the residual defect is made of quartz and a residual defect of a shifter layer, and the removal of the residual defect by the physical means is performed by a focused ion beam, and the region remaining unremoved after the physical removal has a width of 30 to 400 nm from the periphery of the residual defect area over the whole periphery of the residual defect area.

The residual defect referred to herein is a general term for defects, other than the normal pattern, which are constituted by materials for the light-shielding layer, materials for the shifter layer, metallic foreign materials and the like and include a defect in a protruded form continued to the normal pattern and a defect present in a position distant from the normal pattern.

According to the present invention, the physical removal of the residual defect is performed while leaving a defect edge region having a predetermined width from the periphery of the residual defect area over the whole periphery of the residual defect area. Avoiding the extension of the influence of the actinic radiation over the region other than the residual defect area due to the trail of focused ion beam and placement accuracy is the reason why the defect edge region is left. Normally the width of the trail of the focused ion beam is approximately 30 nm.

In the removal of a shifter layer in the quartz engraving Levenson phase shifter photomask using a quartz substrate as the transparent substrate as shown in FIG. 11 (a), chemical etching with a hot alkali or a solution containing hydrofluoric acid is performed to remove the residual defect in the engraved section. In this case, due to the nature of isotropic etching, the side wall in the engraved section is also etched. The degree of the side etching is preferably about 0.09 to 0.20 $\mu$m for each side.

Therefore, the upper limit of the width of the residual defect, to be removed by the chemical etching, in the engraved area is 0.40 $\mu$m (400 nm). When the physical removal of the residual defect is performed using a focused ion beam, this width may be suitably selected in the range of from 30 to 400 nm.

The engraved section 630 in the quartz engraving Levenson phase shift photomask shown in FIG. 11 (a) may be prepared by anisotropic dry etching of Qz (quartz) with a fluorine-containing gas. The anisotropic etching forms an excessively perpendicular side wall and hence causes the intensity of light in the exposure to become lower than the Qz (quartz) in its unengraved area. Therefore, side wet etching of about 90 to 200 nm for each side is performed with a hot alkali or a solution composed mainly of hydrofluoric acid to recover those intensity of light in the exposure.

The present invention, by virtue of the above constitution, can provide a method for repairing a photomask by removing a residual defect in the photomask which can solve various problems of the prior art, that is, problems involved in the repair of the photomask by the conventional laser beam irradiation, such as a problem associated with various maladjustments, a problem derived from the focusing limit of the laser beam, and a problem of roughening in the repaired area, and problems involved in the repair of the photomask by the focused ion beam irradiation, such as damage to the transparent substrate (quartz glass or the like) and a problem of gallium stain, and can be put to practical use.

Therefore, the method according to the present invention can cope with demands involved in the fine fabrication of devices, that is, a reduction in size of a residual defect removed in the repair of a photomask and an improvement in repair accuracy.

Specifically, the step (a) of applying actinic radiation to the residual defect area to physically remove the residual defect except for a defect edge region having a predetermined width from the periphery of the residual defect area over the whole periphery of the residual defect area and the step (b) of removing the defect edge region, remaining unremoved by the physical means, having a predetermined width from the periphery of the residual defect area over the whole periphery of the residual defect area by chemical etching with a chemical are carried out in that order in such a manner that the predetermined width is such that the influence of the actinic radiation does not extend over the outside of the residual defect area and, at the same time, the etching time can be set so that the defect edge region having a predetermined width from the periphery is removed by the chemical etching without any substantial influence on other layers including a light-shielding layer, thereby solving problems involved in the repair of the photomask by the conventional laser beam irradiation, such as a problem associated with various types of maladjustments and a problem derived from the focusing limit of the laser beam.

When the actinic radiation is a laser beam, the irregularities in the glass section in its area repaired by removing the residual defect may be, if necessary, removed with a chemical to solve the problem of the roughening, created by the laser beam irradiation, in the repaired area. When the residual defect has the same composition as the conventional light-shielding layer, constituted by a chromium layer or by a laminate composed of a chromium layer and a chromium oxide layer provided on the chromium layer, use of a hot alkali or a solution composed mainly of hydrofluoric acid as the chemical for chemical etching enables irregularities on the surface of a transparent substrate, such as a quartz substrate, to be removed simultaneously with the chemical etching.

When the actinic radiation is a focused ion beam, a gallium stain created by the focused ion beam irradiation may be, if necessary, removed with a chemical to solve the problems of gallium stain and the like. Further, use of a hot alkali or a solution composed mainly of hydrofluoric acid as the chemical for chemical etching enables the gallium stain to be removed simultaneously with the chemical etching.

When the actinic radiation is a focused ion beam, the focused ion beam irradiation enhanced by etching assist gas can offer better treatment results.

When the photomask is a phase shift photomask, it can more fully cope with the fine fabrication of devices. When the phase shift photomask is a halftone phase shift mask or a Levenson phase shift photomask, which has been put to practical use, the present invention can be particularly effectively applied.

More specifically, the present invention can be applied also to the cases where the Levenson phase shift photomask is of quartz substrate engraving type or a Cr on shifter type and the quartz substrate in its portion underlying the light-shielding layer or the phase shifter layer has an undercut.

In particular, in the removal of a shifter layer of the quartz engraving Levenson phase shift photomask using a quartz substrate as the transparent substrate as shown in FIG. 11, the width of the region remaining unremoved after the physical removal from the periphery of the residual defect area over the whole periphery of the residual defect area wherein the etching time can be set so that the defect edge region can be removed by the chemical etching without any substantial influence on other layers, such as a light-shielding layer, may be up to 400 nm, offering very good treatment results.

PREFERRED EMBODIMENTS OF THE INVENTION

The method, according to the present invention, for repairing a photomask by removing a residual defect, in the photomask, causative of a partial deterioration in light transmittance of the photomask in its residual defect area and an area around the residual defect area to recover the light transmittance of said areas in the photomask can be applied to the repair of a residual defect in a conventional photomask comprising a transparent substrate having on one surface thereof a light-shielding layer of chromium, molybdenum silicide or the like, as well as in various phase shift photomasks as shown in FIG. 11.

The method for repairing a photomask by removing a residual defect in the photomask will be described in more detail with reference to the accompanying drawings.

Figure 1:
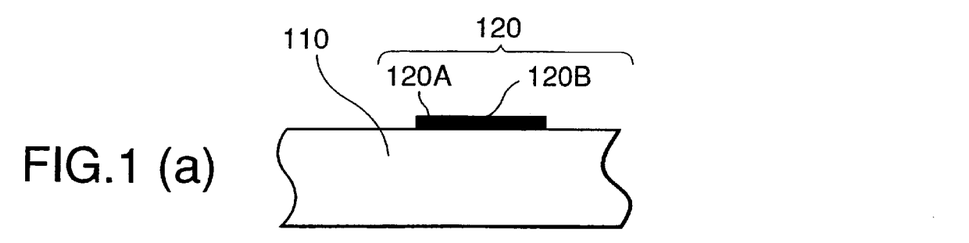
FIG. 1 is a schematic diagram illustrating the method for repairing a photomask by removing a residual defect in the photomask according to the present invention, wherein FIGS. 1 (*a*), 1 (*b*), 1 (*c*), 1 (*d*) and 1 (*e*) are cross-sectional views showing respective steps of repairing an area including a residual defect, FIGS. 2 (*a*) and 2 (*b*) are plan views respectively for the steps shown in FIGS. 1 (*a*) and 1 (*c*)

FIG. 1 is a schematic diagram illustrating the steps of the method for repairing a residual defect in the photomask according to the present invention, wherein, for simplification, a defect area alone is shown.

Figure 2:
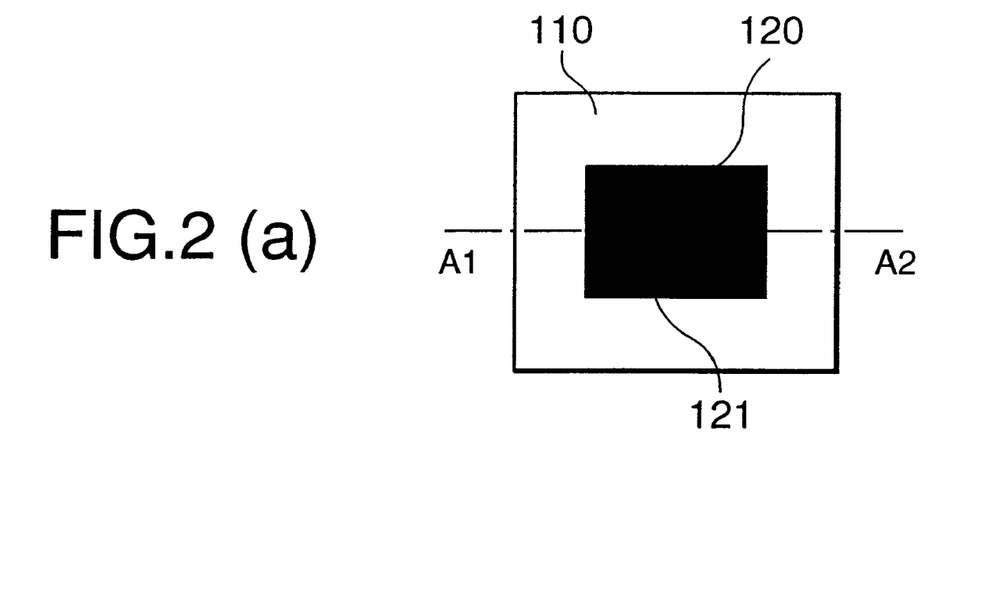

FIGS. 1 (a), 1 (b), 1 (c), 1 (d) and 1 (e) are cross-sectional views showing respective steps of repairing an area including a residual defect 120, and FIGS. 2 (a) and 2 (b) are plan views respectively for the steps shown in FIGS. 1 (a) and 1 (c).

In this connection, it should be noted that FIG. 1 (a) is a cross-sectional view taken on line A1–A2 of FIG. 2 (a), and parts indicated by reference numerals in FIGS. 1 (b) and 1 (c) correspond respectively to parts indicated by the same reference numerals in FIG. 1 (a).

In FIGS. 1 and 2, numeral 110 designates a transparent substrate, numeral 120 a residual defect, numerals 120A and 120B a defect region, numeral 121 a periphery of the residual defect, and numeral 130 actinic radiation.

At the outset, the actinic radiation 130 (FIG. 1 (b)) is applied to the residual defect 120 (FIG. 1 (a)) on the transparent substrate 110 to physically remove the residual defect 120 in its region 120B while leaving a defect edge region 120A having a width of 30 to 400 nm from the periphery 121 of the residual defect area 120 (FIG. 1 (c)).

The actinic radiation 130 should be able to physically remove the residual detect area, and examples thereof include a laser beam and a focused ion beam.

For the laser beam, a second harmonic (0.53 $\mu$m) of YAG laser is generally used for removal of a light-shielding layer composed mainly of chromium or molybdenum silicide. Besides this laser, KrF excimer laser, carbon dioxide laser as infrared laser and the like may be used according to the material of the defect to be removed and the purposes to be achieved.

Although the focused ion beam is not particularly limited, gallium ion beam is generally used.

The defect edge region 120A, which has remained unremoved after the actinic radiation 130 irradiation, is then removed by chemical etching (FIG. 1 (d)).

The chemical used is selected according to the material of the residual defect. For example, when the material to be removed is chromium, chromium oxide, chromium nitride oxide, or quartz, a hot alkali solution or a solution composed mainly of hydrofluoric acid may be applied.

When the laser beam is used as the actinic radiation 130, the irradiation of the residual defect area with the laser beam creates irregularities on the 111 face of the transparent substrate 110. The transparent substrate 110 is usually made of quartz, and, in this case, during the removal of the defect edge region 120A by chemical etching with a hot alkali solution or a solution composed mainly of hydrofluoric acid, the 111 face of the transparent substrate 110 is also etched to render the face smooth, thus permitting the irregularities to be removed. That is, the removal of the defect edge region 120A by the etching and the removal of the irregularities (smoothing of the 111 face) of the transparent substrate 110 can be simultaneously performed.

In the application of laser beams as the actinic radiation 130 followed by the removal of the defect edge region 120A by the chemical etching, when an etchant such as not having a capability of etching the 111 face is used, it is possible to use a method wherein the repaired area is separately treated with an etchant capable of smoothing the 111 face of the transparent substrate 110 (for example, a hot alkali solution or a solution composed mainly of hydrofluoric acid).

When a focused ion beam using a gallium ion is used as the actinic radiation 130, the focused ion beam irradiation results in the creation of gallium stain. The transparent substrate 110 is usually made of quartz, and, in this case, during the removal of the defect edge region 120A by chemical etching with a hot alkali solution or a solution composed mainly of hydrofluoric acid, the gallium stain also could be removed. In the application of a gallium focused ion beam as the actinic radiation 130 followed by the removal of the defect edge region 120A by the chemical etching, when an etchant not having a capability of removing the gallium stain is used, it is possible to use a method wherein the repaired area is separately treated with an etchant capable of removing the gallium stain (for example, a hot alkali solution or a solution composed mainly of hydrofluoric acid) (FIG. 1 (e)).

The present invention will be described in more detail with reference to the following examples, though it is not limited to these examples only.

EXAMPLE 1

This example will be described with reference to FIGS. 3 and 4.

Figure 3:
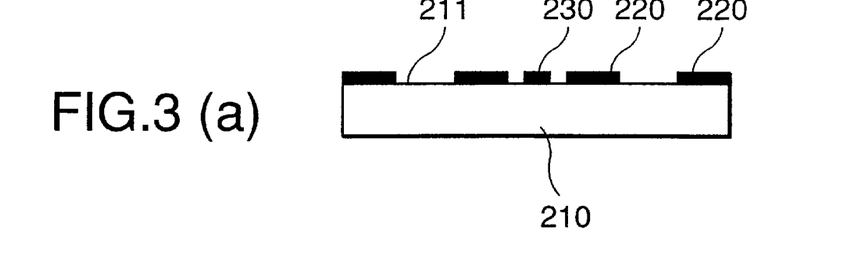
FIGS. 3 and 4 are schematic diagrams showing the steps of a preferred embodiment of the method for repairing a photomask by removing a residual defect in the photomask according to the present invention, wherein FIGS. 3 (*a*), 3 (*b*), and 3 (*c*) are cross-sectional views showing respective steps of repairing an area including a residual defect, FIGS. 4 (*a*), 4 (*b*), and 4 (*c*) are plan views respectively for the steps shown in FIGS. 3 (*a*), 3 (*b*), and 3 (*c*), and FIG. 3 (*d*) is an enlarged view of a region including the defect area shown in FIG. 4 (*b*)
Figure 4:
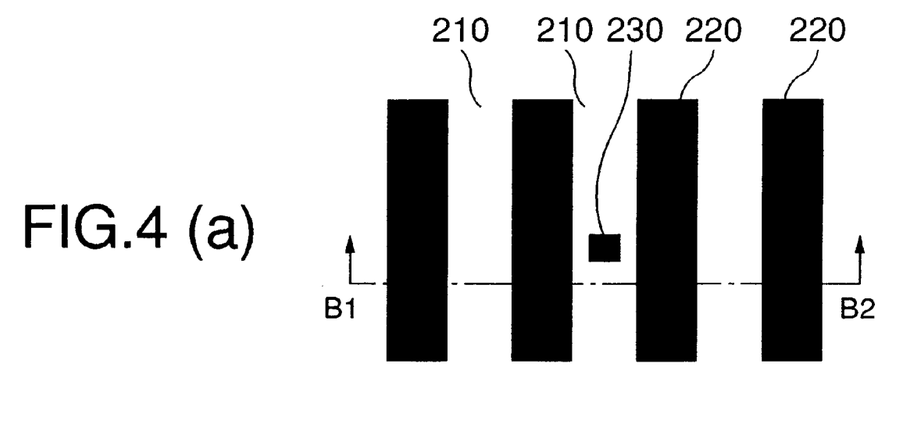

FIGS. 3 and 4 are schematic diagrams showing the steps of a preferred embodiment of the method for repairing a photomask by removing a residual defect in the photomask according to the present invention, wherein FIGS. 3 (a), 3 (b), and 3 (c) are cross-sectional views showing respective steps of repairing an area including a residual defect 230 and FIGS. 4 (a), 4 (b), and 4 (c) are plan views respectively for the steps shown in FIGS. 3 (a), 3 (b), and 3 (c).

In this connection, it should be noted that FIG. 3 (a) is a cross-sectional view taken on line B1–B2 of FIG. 4 (a), and parts indicated by reference numerals in FIGS. 3 (b) and 3

(c) correspond respectively to parts indicated by the same reference numerals in FIG. 3 (a). FIG. 3 (d) is an enlarged view of a region including the defect area shown in FIG. 4 (b).

In FIGS. 3 and 4, numeral 210 designates a transparent substrate, numerals 211 and 212 a face, numeral 220 a light-shielding layer, and numeral 230 a residual defect.

The present example demonstrates the removal of a residual defect in a conventional photomask comprising the transparent substrate 210, constituted by a quartz substrate, having thereon a pattern of the light-shielding layer 220 provided by laminating a chromium layer (thickness: 130 nm) and chromium oxide (thickness: several nm) in that order.

The photomask is a reticule for the preparation of a device provided with two chips of 64 MDRAM and is a word line layer. It was prepared by disposing a novolak, positive-working resist NPR 895I (manufactured by Nagase & Co., Ltd.) onto a photomask blank, writing a pattern with a laser writing device (CORE 2564, manufactured by ETEC), performing development with an inorganic alkali developer, wet etching the chromium in the opening with an etchant composed mainly of ammonium ceric nitrate, stripping the resist and then washing the resultant photomask. After the cleaning, the photomask was inspected for a defect by means of an appearance tester (331, manufactured by KLA). As a result, a residual defect (230 in FIG. 3), having a size of about 0.6 $\mu$m square, of the light-shielding layer was detected (FIG. 3 (a)).

A laser repairing device (SL-453C, manufactured by NEC Corp.) was provided, and a second harmonic (0.53 $\mu$m) of YAG laser was applied to the residual defect 230 to remove the residual defect 230 except for a defect edge region 230A having a width of about 60 nm from the periphery of the defect 230 (FIG. 3 (b)).

In this stage, the light transmittance of the photomask was measured with a phase measurement system MPM-248 (manufactured by Lasertec Corp.). As a result, the light transmittance of the repaired area was found to be about 3% lower than that of the other area.

The photomask was then immersed for 60 min in a 10% NaOH solution at a temperature of 70° C.±1° C. while stirring the solution, thereby removing the remaining defect edge region 230A by chemical etching (FIG. 3 (c)).

After cleaning, the light transmittance of the repaired area in the photomask was measured again and found to be substantially the same as that of the other area, indicating the recovery of the light transmittance of the photomask in its repaired area.

EXAMPLE 2

This example will be described with reference to FIGS. 5 and 6.

Figure 5:
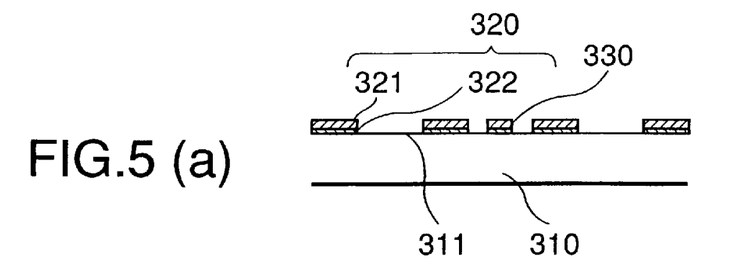
FIGS. 5 and 6 are schematic diagrams showing the steps of another preferred embodiment of the method for repairing a photomask by removing a residual defect in the photomask according to the present invention, wherein FIGS. 5 (*a*), 5 (*b*), and 5 (*c*) are cross-sectional views showing respective steps of repairing an area including a residual defect, FIGS. 6 (*a*), 6 (*b*), and 6 (*c*) are plan views respectively for the steps shown in FIGS. 5 (*a*), 5 (*b*), and 5 (*c*), and FIG. 5 (*d*) is an enlarged view of a region including the defect area shown in FIG. 6 (*b*)
Figure 6:
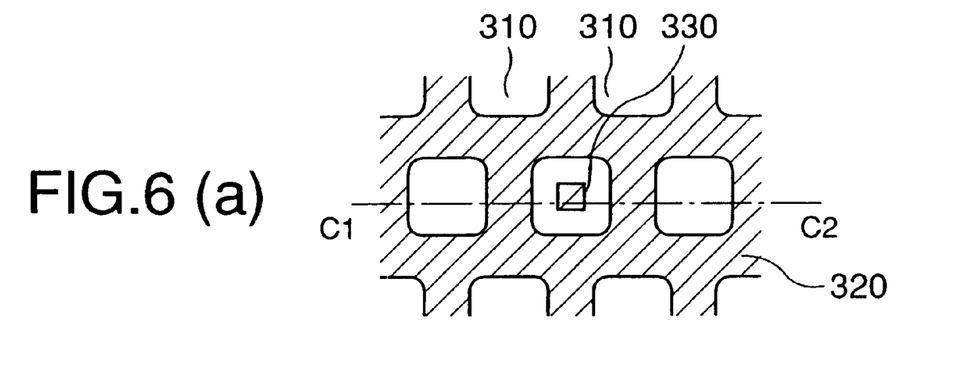

FIGS. 5 and 6 are schematic diagrams showing the steps of another preferred embodiment of the method for repairing a photomask by removing a residual defect in the photomask according to the present invention, wherein FIGS. 5 (a), 5 (b), and 5 (c) are cross-sectional views showing respective steps of repairing an area including a residual defect 320 and FIGS. 6 (a), 6 (b), and 6 (c) are plan views respectively for the steps shown in FIGS. 5 (a), 5 (b), and 5 (c).

In this connection, it should be noted that FIG. 5 (a) is a cross-sectional view taken on line C1–C2 of FIG. 6 (a), and parts indicated by reference numerals in FIGS. 5 (b) and 5 (c) correspond respectively to parts indicated by the same reference numerals in FIG. 5 (a). FIG. 5 (d) is an enlarged view of a region including the defect area shown in FIG. 6 (b).

In FIGS. 5 and 6, numeral 310 designates a transparent substrate, (numerals 311 and 312 a face,) numeral 320 an attenuated layer, numeral 321 chromium nitride oxide, numeral 322 chromium nitride, numeral 330 a residual defect, numeral 340 a focused ion beam, and numeral 350 an etching gas.

The present example demonstrates the removal of a residual defect in an i-line halftone phase shift photomask comprising the transparent substrate 310 having thereon a pattern of the halftone layer 320 provided by laminating chromium nitride 322 (thickness: 10 nm) and chromium nitride oxide 321 (thickness: 139 nm) in that order.

The photomask is a reticule for the preparation of a device provided with three chips of 16 MDRAM and is a contact hole layer. It was prepared by disposing a novolak, positive-working resist NPR 895I (manufactured by Nagase & Co., Ltd.) onto a photomask blank, writing a pattern with a laser writing device (CORE 2564, manufactured by ETEC), performing development with an inorganic alkali developer, dry etching the chromium nitride oxide and chromium nitride in the opening by reactive ion etching using a mixed gas composed of dichloromethane ($CH_2Cl_2$) and oxygen, stripping the resist and then washing the resultant photomask. After the washing, the photomask was inspected for a defect by means of an appearance tester (331, manufactured by KLA). As a result, a residual defect (330 in FIGS. 5 and 6), having a size of about 0.4 $\mu$m square, of the halftone layer was detected (FIG. 5 (a)).

A focused ion beam device SIR 1500$\alpha$ (manufactured by Seiko Instruments Inc.) was provided, and a gallium ion focused ion beam was applied to the residual defect 330 to remove the residual defect 330 while leaving a defect edge region 330A having a width of 30 to 50 nm from the periphery of the defect 330 (FIG. 5 (b)).

Since the chromium nitride oxide 321 and the chromium nitride 322 are inferior in resistance to a hot alkali to chromium, the size of defect left in this stage should be as small as possible.

In this stage, the light transmittance of the photomask was measured with a phase measurement system MPM248 (manufactured by Lasertec Corp.). As a result, the light transmittance of the repaired area was found to be about 10% lower than that of the other area.

The photomask was then immersed for 60 min in a 10% NaOH solution at a temperature of 70° C.±1° C. while stirring the solution, thereby removing the remaining defect edge region 330A by chemical etching (FIG. 5 (c)).

After washing, the light transmittance of the repaired area in the photomask was measured again and found to be substantially the same as that of the other area, indicating the recovery of the light transmittance of the photomask in its repaired area.

EXAMPLE 3

This example will be described with reference to FIGS. 7 and 8.

Figure 7:
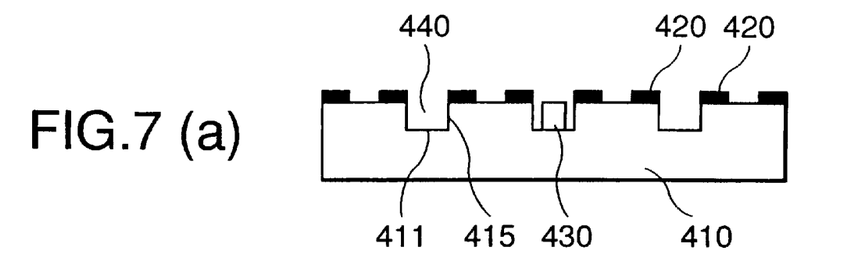
FIGS. 7 and 8 are schematic diagrams showing the steps of still another preferred embodiment of the method for repairing a photomask by removing a residual defect in the photomask according to the present invention, wherein FIGS. 7 (*a*), 7 (*b*), and 7 (*c*) are cross-sectional views showing respective steps of repairing an area including a residual defect, FIGS. 8 (*a*), 8 (*b*), and 8 (*c*) are plan views respectively for the steps shown in FIGS. 7 (*a*), 7 (*b*), and 7 (*c*), FIG. 7 (*d*) is an enlarged view of a region including the defect area shown in FIG. 8 (*b*)
Figure 8:
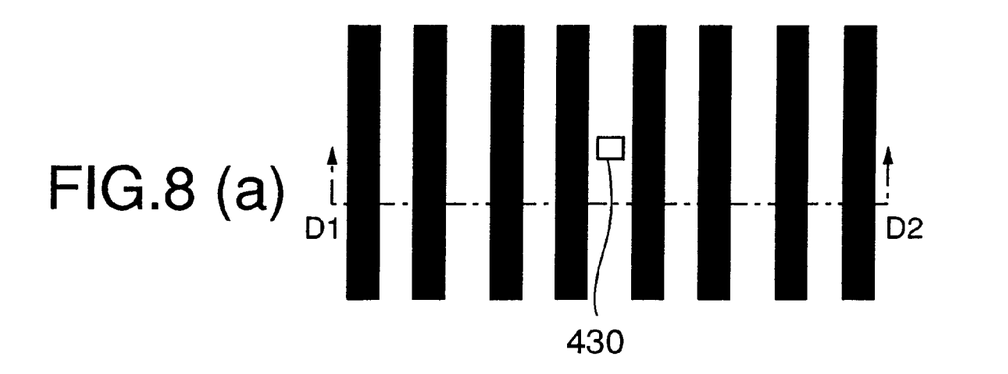

FIGS. 7 and 8 are schematic diagrams showing the steps of still another preferred embodiment of the method for repairing a photomask by removing a residual defect in the photomask according to the present invention, wherein FIGS. 7 (a), 7 (b), and 7 (c) are cross-sectional views showing respective steps of repairing an area including a residual defect 430 and FIGS. 8 (a), 8 (b), and 8 (c) are plan views respectively for the steps shown in FIGS. 7 (a), 7 (b), and 7 (c).

In this connection, it should be noted that FIG. 7 (a) is a cross-sectional view taken on line D1–D2 of FIG. 8 (a), and parts indicated by reference numerals in FIGS. 7 (b) and 7 (c) correspond respectively to parts indicated by the same reference numerals in FIG. 7 (a). FIG. 7 (d) is an enlarged view of a region including the defect area shown in FIG. 8 (b).

In FIGS. 7 and 8, numeral 410 designates a transparent substrate (a quartz substrate Qz), (numerals 411 and 412 bottom face of etched portion), numerals 415 and 416 a side face, numeral 420 a light-shielding layer, numeral 430 a residual defect, and numeral 440 an engraved section or a shifter section.

The present example demonstrates the removal of a residual defect in a Levenson quartz engraving phase shift photomask comprising the transparent substrate 410, constituted by a quartz substrate, having thereon a pattern of the light-shielding layer 420 provided by laminating a chromium layer (thickness: 110 nm) and chromium oxide (thickness: several nm) in that order.

The photomask is a reticle for the preparation of a device provided with two chips of 64 MDRAM and is a bit line layer. It was prepared by disposing a novolak, positive-working resist EBR 900 (manufactured by Toray Industries, Inc.) onto a photomask blank, writing a pattern with an EB writing device MEBES III (manufactured by ETEC), performing development with an inorganic alkali developer, wet etching the chromium oxide and chromium in the opening with an etchant composed mainly of ammonium ceric nitrate, stripping the resist, washing the resultant photomask, recoating the resist EBR 900 (manufactured by Toray Industries, Inc.), writing a pattern with a laser writing device (CORE 2564, manufactured by ETEC), performing development with an inorganic alkali developer, dry etching the shifter (quartz Qz area) in the opening with a $CF_4$ gas, stripping the resist, and washing the photomask. After the washing, the photomask was inspected for a defect by means of an appearance tester (331, manufactured by KLA). As a result, a residual defect (430 in FIG. 7 (a)), having a size of about 1.5 μm square, of the shifter layer was detected (FIG. 7 (a)).

A focused ion beam device SMI 9800 (manufactured by Seiko Instruments Inc.) was provided, and a gallium ion focused ion beam was applied to the residual defect 430 to remove the residual defect 430 while leaving a defect edge region 430A having a width of 100 to 200 nm from the periphery of the defect 430 (FIG. 7 (b)).

In this stage, the light transmittance of the photomask was measured with a phase measurement system MPM-248 (manufactured by Lasertec Corp.). As a result, the light transmittance of the repaired area was found to be about 10% lower than that of the other area.

In general, in the quartz engraving Levenson phase shift photomask, mere etching of Qz (quartz) with a fluorine-based gas forms an excessively perpendicular side wall due to the nature of anisotropic etching and hence causes the intensity of light in the exposure to the stepper to become lower than the Qz (quartz) in its unengraved area. This necessitates the step of performing side wet etching of more than 90 nm with a hot alkali or a solution composed mainly of hydrofluoric acid to recover the intensity of light in the exposure.

To this end, the photomask was then immersed for 60 min in a hot alkali (a 10% NaOH solution at a temperature of 70° C.±1° C.) while stirring the hot alkali, thereby performing side etching of 90 to 400 nm simultaneously with removal of the remaining defect edge region 430A by chemical etching (FIG. 7 (c)).

The treatment brought the shape of the face 411 and the side face 415 shown in FIG. 7 (a) to the shape of the face 412 and the side face 416 shown in FIG. 7 (c).

After washing, the light transmittance of the repaired area in the photomask was measured again and found to be substantially the same as that of the other area, indicating the recovery of the light transmittance of the photomask in its repaired area.

EXAMPLE 4

This example will be described with reference to FIGS. 9 and 10.

Figure 9:
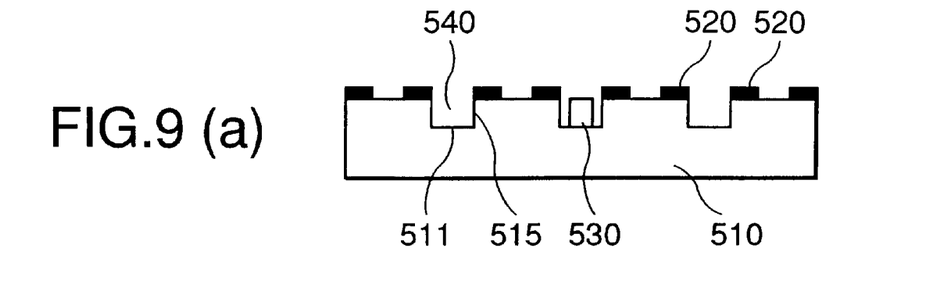
FIGS. 9 and 10 are schematic diagrams showing the steps of a further preferred embodiment of the method for repairing a photomask by removing a residual defect in the photomask according to the present invention, wherein FIGS. 9 (*a*), 9 (*b*), and 9 (*c*) are cross-sectional views showing respective steps of repairing an area including a residual defect, FIGS. 10 (*a*), 10 (*b*), and 10 (*c*) are plan views respectively for the steps shown in FIGS. 9 (a), 9 (b), and 9 (c), and FIG. 9 (d) is an enlarged view of a region including the defect area shown in FIG. 10 (b)
Figure 10:
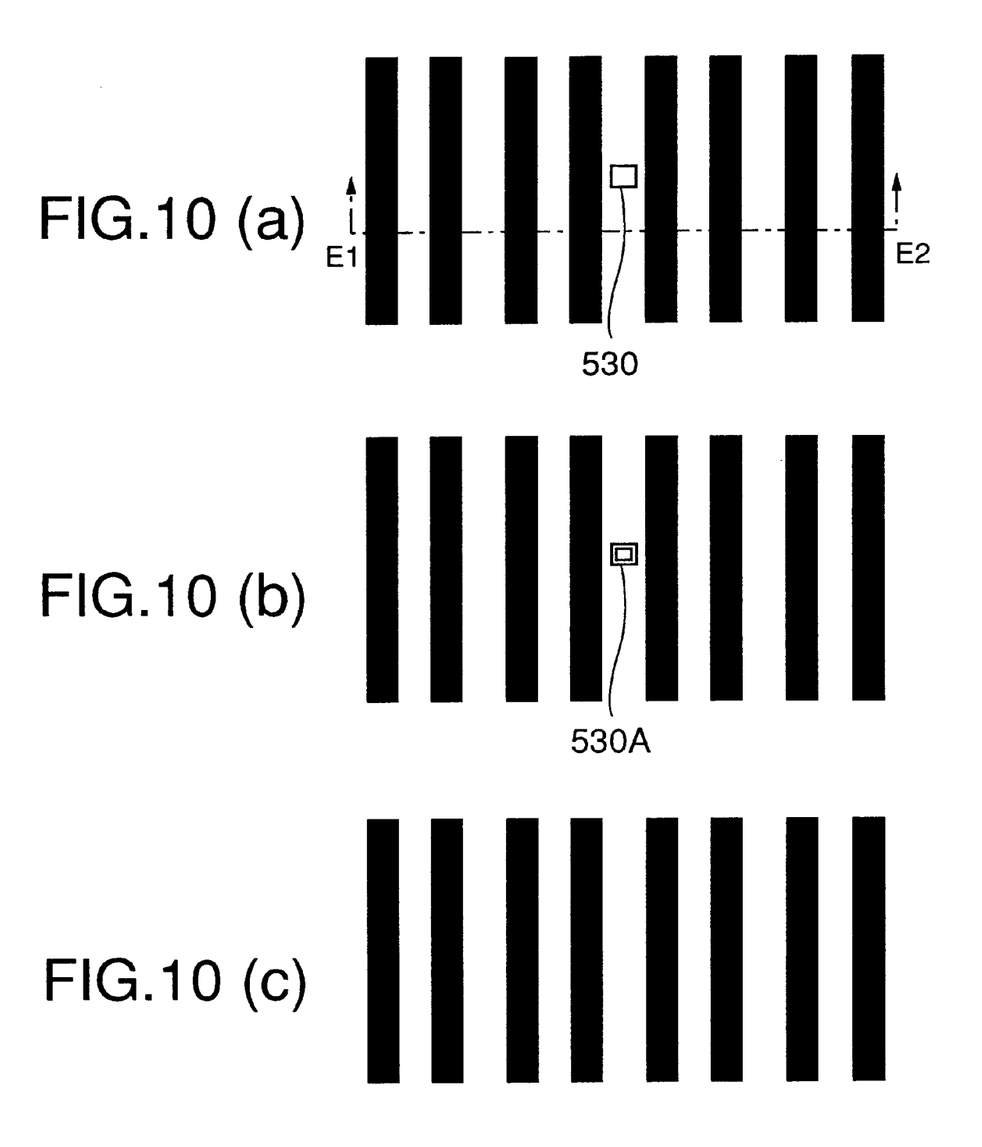

FIGS. 9 and 10 are schematic diagrams showing the steps of a further preferred embodiment of the method for repairing a photomask by removing a residual defect in the photomask according to the present invention, wherein FIGS. 9 (a), 9 (b), and 9 (c) are cross-sectional views showing respective steps of repairing an area including a residual defect 530 and FIGS. 10 (a), 10 (b), and 10 (c) are plan views respectively for the steps shown in FIGS. 9 (a), 9 (b), and 9 (c).

In this connection, it should be noted that FIG. 9 (a) is a cross-sectional view taken on line E1–E2 of FIG. 10 (a), and parts indicated by reference numerals in FIGS. 9 (b) and 9 (c) correspond respectively to parts indicated by the same reference numerals in FIG. 9 (a). FIG. 9 (d) is an enlarged view of a region including the defect area shown in FIG. 10 (b).

In FIGS. 9 and 10, numeral 510 designates a transparent substrate (a quartz substrate Qz), (numerals 511 and 512 a bottom face of etched portion), numerals 515 and 516 a side face, numeral 520 a light-shielding layer, numeral 530 a residual defect, numeral 540 an engraved section, numeral 550 a focused ion beam, and numeral 560 an etching gas.

The present example demonstrates the removal of a residual defect in a Levenson quartz engraving phase shift photomask comprising the transparent substrate 510, constituted by a quartz substrate, having thereon a pattern of the light-shielding layer 520 provided by laminating a chromium layer (thickness: 110 nm) and chromium oxide (thickness: several nm) in that order. Example 4 is the same as Example 3, except that gas assisted treatment was performed simultaneously with the physical removal of the residual defect.

The photomask was a reticle for the preparation of a device provided with two chips of 64 MDRAM and is a bit line layer. It was prepared by disposing a novolak, positive-working resist EBR 900 (manufactured by Toray Industries, Inc.) onto a photomask blank, writing a pattern with an EB writing device MEBES IV (manufactured by ETEC), performing development with an inorganic alkali developer, wet etching the chromium oxide and chromium in the opening with an etchant composed mainly of ammonium ceric nitrate, stripping the resist, washing the resultant photomask, recoating the resist EBR 900 (manufactured by Toray Industries, Inc.), writing a pattern with a laser writing device (CORE 2564, manufactured by ETEC) performing development with an inorganic alkali developer, dry etching the shifter (quartz Qz area) in the opening with a $CF_4$ gas, stripping the resist, and washing the photomask. After the washing, the photomask was inspected for a defect by means of an appearance tester (301 STARlight, manufactured by KLA). As a result, a residual defect (530 in FIG. 9), having a size of about 1.0 μm square, of the shifter layer ($Q_2$) was detected (FIG. 9 (*a*)).

A focused ion beam device SMI 9800 (manufactured by Seiko Instruments Inc.) was provided, and a gallium ion focused ion beam was applied to the residual defect 530. In this case, gas assisted etching using Xenonfluoride (XeF) was simultaneously performed. Thus, the residual defect 530 using Xenonfluoride(XeF) was removed while leaving a defect edge region 530A having a width of 100 to 200 nm from the periphery of the defect 530 (FIG. 9 (*b*)).

In this stage, the light transmittance of the photomask was measured with a phase measurement system MPM-248 (manufactured by Lasertec Corp.). As a result, the light transmittance of the repaired area was found to be substantially the same as that of the other area.

In general, in the quartz engraving Levenson phase shift photomask, mere etching of Qz (quartz) with a fluorine-based gas forms an excessively perpendicular side wall due to the nature of anisotropic etching and hence causes the intensity of light in the exposure to the stepper to become lower than the Qz (quartz) in its unengraved area. This necessitates the step of performing side wet etching of more than 90 nm with a hot alkali or a solution composed mainly of hydrofluoric acid to recover the intensity of light in the exposure.

To this end, the photomask was then immersed for 60 min in a hot alkali (a 10% NaOH solution at a temperature of 70° C.±1° C.) while stirring the hot alkali, thereby performing side etching of 90 to 400 nm simultaneously with removal of the remaining defect edge region 530A by chemical etching (FIG. 9 (*c*)).

The treatment brought the shape of the face 511 and the side face 515 shown in FIG. 9 (*a*) to the shape of the face 512 and the side face 516 shown in FIG. 9 (*c*).

After washing, the light transmittance of the repaired area in the photomask was measured again and found to be substantially the same as that of the other area, indicating the recovery of the light transmittance of the photomask in its repaired area.

What is claimed is:

1. A method for repairing a photomask by removing a residual defect, in the photomask, causative of a partial deterioration in light transmittance of the photomask in its residual defect area and an area around the residual defect area to recover the light transmittance of said areas in the photomask, the method comprising the steps of:

(a) applying actinic radiation to the residual defect area to physically remove the residual defect except for a defect edge region having a predetermined width from the periphery of the residual defect area over the whole periphery of the residual defect area; and (b) removing the defect edge region, remaining unremoved by the physical means, having a predetermined width from the periphery of the residual defect area over the whole periphery of the residual defect area by chemical etching with a chemical, the predetermined width being such that the influence of the actinic radiation does not extend over the outside of the residual defect area and, at the same time, the etching time can be set so that the defect edge region having a predetermined width from the periphery is removed by the chemical etching without any substantial influence on other layers including a light-shielding layer.

2. The method according to claim 1, wherein the actinic radiation is a laser beam and, if necessary, a transparent substrate, constituting the photomask, in its area repaired by removing the residual defect is treated with a chemical to remove irregularities in the repaired area.

3. The method according to claim 1, wherein the actinic radiation is a laser beam and the chemical for chemical etching is a hot alkali or a solution composed mainly of hydrofluoric acid.

4. The method according to claim 1, wherein the actinic radiation is a focused ion beam and, if necessary, the area repaired by removing the residual defect is treated with a chemical to remove a gallium stain created by the focused ion beam irradiation.

5. The method according to claim 1, wherein the actinic radiation is a focused ion beam and the chemical for chemical etching is a hot alkali or a solution composed mainly of hydrofluoric acid.

6. The method according to claim 4, wherein, in the repair of the photomask, assist gas enhances the etching simultaneously with the focused ion beam irradiation.

7. The method according to claim 1, wherein the photomask is a phase shift photomask.

8. The method according to claim 7, wherein the phase shift photomask is a halftone phase shift photomask or a Levenson phase shift photomask.

9. The method according to claim 8, wherein the Levenson phase shift photomask is of a quartz substrate engraving type using a quartz substrate as a transparent substrate or of a Cr on shifter type.

10. The method according to claim 9, wherein the Levenson phase shift photomask is of a quartz substrate engraving type using a quartz substrate as a transparent substrate, the light-shielding layer is composed mainly of chromium, the residual defect is made of quartz and a residual defect of a shifter layer, and the removal of the residual defect by the physical means is performed by a focused ion beam, and the region remaining unremoved after the physical removal has a width of 30 to 400 nm from the periphery of the residual defect area over the whole periphery of the residual defect area.

11. The method according to claim 8, wherein the quartz substrate in its portion underlying the light-shielding layer or the phase shifter layer has an undercut.

* * * * *